United States Patent
Kylkilahti et al.

(10) Patent No.: US 10,965,037 B2
(45) Date of Patent: Mar. 30, 2021

(54) MULTI-ANTENNA SYSTEM

(71) Applicant: HUAWEI TECHNOLOGIES CO., LTD., Shenzhen (CN)

(72) Inventors: Mikko Kylkilahti, Helsinki (FI); Esa Maatta, Helsinki (FI); David Powney, Helsinki (FI); Ilkka Niemela, Helsinki (FI); Jari Lamminparras, Helsinki (FI); Kyosti Kataja, Helsinki (FI); Jouni Pennanen, Helsinki (FI); Ilkka Saarinen, Helsinki (FI); Guoping Luo, Helsinki (FI); Ismo Manelius, Helsinki (FI)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/618,264

(22) PCT Filed: May 30, 2017

(86) PCT No.: PCT/EP2017/062953
§ 371 (c)(1),
(2) Date: Nov. 29, 2019

(87) PCT Pub. No.: WO2018/219430
PCT Pub. Date: Dec. 6, 2018

(65) Prior Publication Data
US 2020/0119452 A1    Apr. 16, 2020

(51) Int. Cl.
*H01Q 21/00* (2006.01)
*H01Q 1/38* (2006.01)
(Continued)

(52) U.S. Cl.
CPC .......... *H01Q 21/0006* (2013.01); *H01P 3/08* (2013.01); *H01Q 1/38* (2013.01); *H05K 1/02* (2013.01);
(Continued)

(58) Field of Classification Search
CPC ........ H01Q 21/0006; H01Q 1/38; H01Q 1/50; H01Q 21/00; H05K 1/0243; H05K 1/14;
(Continued)

(56) References Cited

U.S. PATENT DOCUMENTS 6,064,350 A  *  5/2000  Uchimura .......... H01Q 21/0093
                                                    343/786
6,797,891 B1     9/2004  Blair et al.
(Continued)

FOREIGN PATENT DOCUMENTS

CN    103983699 A    8/2014
CN    204131507 U    1/2015
(Continued)

OTHER PUBLICATIONS

Office Action dated Apr. 23, 2020 from corresponding application No. CN 201780091029.7.
(Continued)

*Primary Examiner* — Hai V Tran
(74) *Attorney, Agent, or Firm* — Hauptman Ham, LLP

(57) ABSTRACT

A multi-antenna system includes an antenna part and a cable part. The antenna part includes comprising antenna lines forming antenna elements. The cable part includes a feeding lines for the antenna elements. Both the antenna part and the cable part are implemented using a flexible printed circuit board. The antenna part includes a single conductor layer area. The cable part includes a three conductor layer area.

20 Claims, 3 Drawing Sheets

(51) Int. Cl.
  *H05K 1/02* (2006.01)
  *H01P 3/08* (2006.01)
  *H05K 1/14* (2006.01)
  *H04B 7/0413* (2017.01)

(52) U.S. Cl.
  CPC ......... *H05K 1/0243* (2013.01); *H05K 1/0277* (2013.01); *H05K 1/14* (2013.01); *H04B 7/0413* (2013.01); *H05K 2201/015* (2013.01); *H05K 2201/0141* (2013.01); *H05K 2201/0154* (2013.01); *H05K 2201/10098* (2013.01)

(58) Field of Classification Search
  CPC ........ H05K 1/0277; H05K 1/118; H05K 1/02; H01P 3/08
  USPC ......................................................... 343/905
  See application file for complete search history.

(56) References Cited

U.S. PATENT DOCUMENTS

| | | | |
|---|---|---|---|
| 2003/0030586 A1 | 2/2003 | Suzuki et al. | |
| 2009/0111533 A1* | 4/2009 | Johansson | H01R 13/502 455/575.1 |
| 2013/0321240 A1 | 12/2013 | O'Shea et al. | |
| 2013/0342410 A1 | 12/2013 | Wu et al. | |
| 2014/0354900 A1* | 12/2014 | Qian | H05K 1/028 349/12 |
| 2016/0099738 A1* | 4/2016 | Kodama | H05K 1/147 455/575.6 |
| 2016/0111779 A1* | 4/2016 | Ma | H01Q 1/521 343/841 |
| 2016/0126621 A1 | 5/2016 | Yano et al. | |
| 2016/0322714 A1* | 11/2016 | Ying | H01Q 21/30 |
| 2017/0149111 A1 | 5/2017 | Yosui et al. | |
| 2018/0192864 A1* | 7/2018 | Yazdi | A61B 1/267 |
| 2018/0241430 A1* | 8/2018 | Youn | G06F 1/1656 |
| 2019/0027801 A1* | 1/2019 | Oguri | H01P 5/085 |

FOREIGN PATENT DOCUMENTS

| | | |
|---|---|---|
| EP | 1986477 A2 | 10/2008 |
| JP | 2003087022 A | 3/2003 |
| WO | 2017051649 A1 | 3/2017 |

OTHER PUBLICATIONS

Office Action dated Jun. 16, 2020 and English translation from corresponding application No. JP 2019-559312.
International search report dated Feb. 22, 2018 from corresponding application No. PCT/EP2017/062953.

* cited by examiner

MULTI-ANTENNA SYSTEM

This application is a National Stage of International Patent Application No. PCT/EP2017/062953, filed on May 30, 2017.

TECHNICAL FIELD

The present application relates to the field of wireless communications, and more particularly to multi-antenna systems.

BACKGROUND

A multi-antenna system uses multiple antenna elements or antenna patterns that are often placed in an apparatus in an organized way. The antenna elements are sometimes separated from each other by certain distances based on various specifications associated with, for example, gain of an antenna array, beam steering properties, isolation between elements, envelope correlation coefficient, etc. Further, each antenna element usually has its own feeding line.

Micro coaxial cables may be used as feeding lines to connect the antenna elements to radio frequency (RF) electronics. If there are multiple antennas in an apparatus, the number of cables is usually the same as the number of antenna elements. This leads to a complex antenna element and micro coaxial cable arrangement with several interconnections. This would also consume a lot of space, as well as sets challenges to manufacturability and final assembly.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

to the discussed embodiments provide a solution for a multi-antenna system that makes use of a flexible printed circuit (FPC) technology.

An aspect of the present application is associated with a multi-antenna system that comprises an antenna part comprising antenna lines forming antenna elements and a cable part comprising feeding lines for the antenna elements. Both the antenna part and the cable part are implemented using a flexible printed circuit (FPC) board. In some embodiments, a solution where a complex multiple antenna system including antenna radiators, feeding cables and possibly also other components can be implemented on an FPC board. Such an FPC can easily be assembled into a wireless communication apparatus and accurately placed into the wireless communication apparatus mechanics. In some embodiments, a cost benefit is provided as compared, for example, to micro coaxial cable systems. Further, some embodiments provide a solution that is thinner than, for example, two micro coaxial cable systems.

In some embodiments, the antenna part and the cable part are made of a single integrated flexible printed circuit board. Such a single integrated flexible printed circuit board enables a continuous signal path without discontinuity points, thus providing better electrical performance.

In some embodiments, the antenna part comprises a single conductor layer area and the cable part comprises a three conductor layer area. A single layer conductor area is easy to bend to a form which is often required due to the mechanical environment in question.

In some embodiments, a layer comprising the antenna part is made of a different material than a layer comprising the cable part. This enables a solution where a lower cost material can be used in the layer comprising the antenna part.

In some embodiments, the antenna part is configured in a first flexible printed circuit board and the cable part is configured in a second flexible printed circuit board, the first flexible printed circuit board and the second flexible printed circuit board being interconnected to each other. In case the antenna part is very large, the usage of a low cost material in the first flexible printed circuit board can provide a significant cost advantage.

In some embodiments, the first flexible printed circuit board and the second flexible printed circuit board are interconnected to each other with a low resistance direct interconnection technology. This enables a solution that provides the lowest interconnection stacking height.

In some embodiments, the low resistance direct interconnection technology comprises one of the following: hotbar soldering or anisotropically conductive adhesive. A low interconnection resistance enables keeping resistive losses low enough for radio frequency signals.

In some embodiments, the cable part utilizes a low dielectric loss material. This provides a solution that enables ensuring the thinnest possible structure with sufficient performance in terms of dielectric and conductor loss.

In some embodiments, the antenna part utilizes a single conductor layer substrate material. This enables a solution where cost efficiency can be achieved while at the same time maintaining electrical performance requirements.

In some embodiments, the cable part utilizes a stripline form to enable electrically matched and protected signal path.

In some embodiments, the flexible printed circuit board comprises antenna matching components. This provides an integrated and a simple solution that saves space and enables placing a matching component near antenna feeding points for better electrical performance.

In some embodiments, the cable part comprises a signal line for a sensor. This provides an integrated and a simple solution that saves space by enabling interconnection from driving electronics to the area of the mobile apparatus where the sensor or sensors are typically needed to be placed.

In some embodiments, the cable part comprises a signal line for a light component. This provides an integrated and a simple solution that saves space by enabling interconnection from driving electronics to the area of the mobile apparatus where light components can be placed.

In some embodiments, the cable part comprises a signal line for a universal serial bus interface. This provides an integrated and a simple solution that saves space by providing signal path in form of a flexible printed circuit that already utilizes materials giving good electrical properties.

In some embodiments, the cable part comprises a signal line for a switch. This provides an integrated and simple solution that saves space. Typically switches are located on the sides of the mobile apparatus, thus being in the same area than the multi-antenna system.

Another aspect of the present application is associated with a wireless communication apparatus that comprises a printed circuit board and a multi-antenna system according to the first aspect or any of its implementation forms connected to the printed circuit board. In some embodiments, a solution is provided where a complex multiple antenna system including antenna radiators, feeding cables and possibly also other components can be implemented on a flexible printed circuit board. Such a flexible printed circuit board can easily be assembled into a wireless communication apparatus and accurately placed into the wireless communication apparatus mechanics.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

DETAILED DESCRIPTION

The detailed description provided below in connection with the appended drawings is intended as a description of some example embodiments and is not intended to represent the only forms in which the embodiments may be constructed or utilized. However, the same or equivalent functions and structures may be accomplished by different embodiments.

Although several aspects and embodiments may be described in terms of a mobile apparatus, it is by way of example and in no way a limitation. The disclosed solution may be applicable also to any wireless apparatus having wireless communication capabilities and comprising a multi-antenna system.

Figure 1:
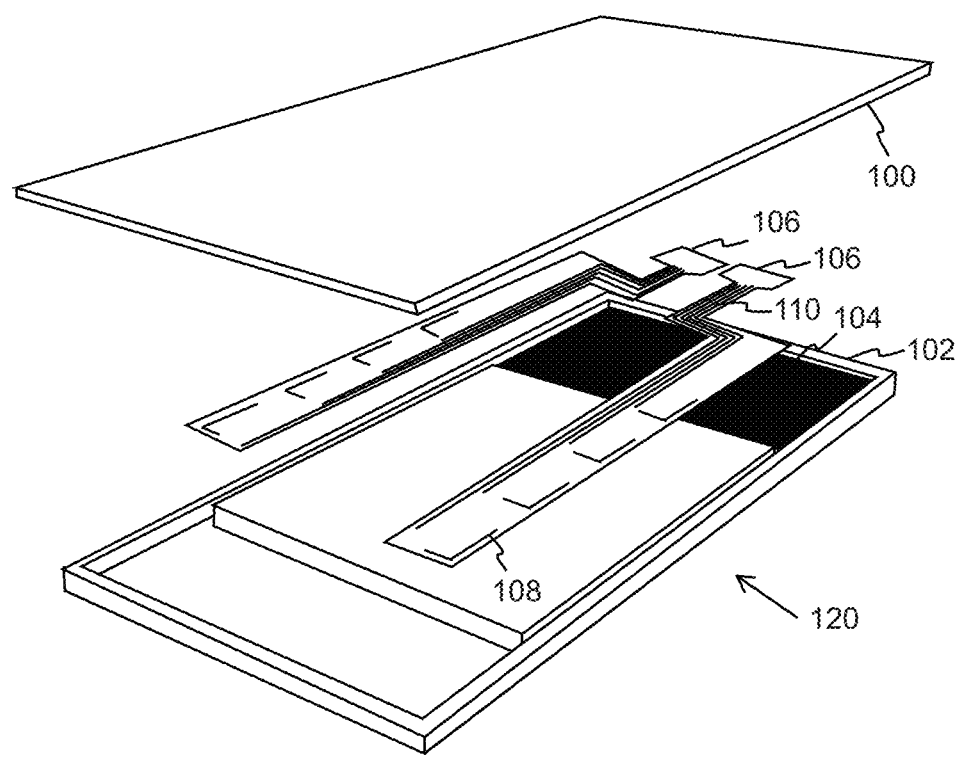
FIG. 1 illustrates a schematic representation of a mobile apparatus, in accordance with one or more embodiments.

FIG. 1 illustrates a simplified schematic representation of a mobile apparatus 120, in accordance with one or more embodiments. The mobile apparatus 120 comprises a back cover 100, a front cover 102 and a printed circuit board 104. In some embodiments, the mobile apparatus 120 may additionally comprise various elements and components not disclosed in FIG. 1, for example, a battery, a camera module, a microphone, a speaker etc.

In some embodiments, the mobile apparatus 120 comprises a multi-antenna system. The multi-antenna system may be a multiple-input and multiple-output (MIMO) system or an antenna array. The multi-antenna system comprises an antenna part 108 comprising antenna lines forming antenna elements and a cable part 110 comprising feeding lines for the antenna elements. Both the antenna part 108 and the cable part 110 are implemented using a flexible printed circuit (FPC) board. The mobile apparatus 120 also comprises connectors 106 for connecting the multi-antenna system to the printed circuit board 104.

In some embodiments, a solution is provided where a complex multiple antenna system including antenna radiators, feeding cables and possibly also other components can be implemented in an FPC board. Such an FPC can easily be assembled into the mobile apparatus and accurately placed into the mobile apparatus mechanics. This also provides a cost benefit compared, for example, to micro coaxial cable systems. Further, a solution is provided that is thinner than, for example, to micro coaxial cable systems.

Figure 2A:
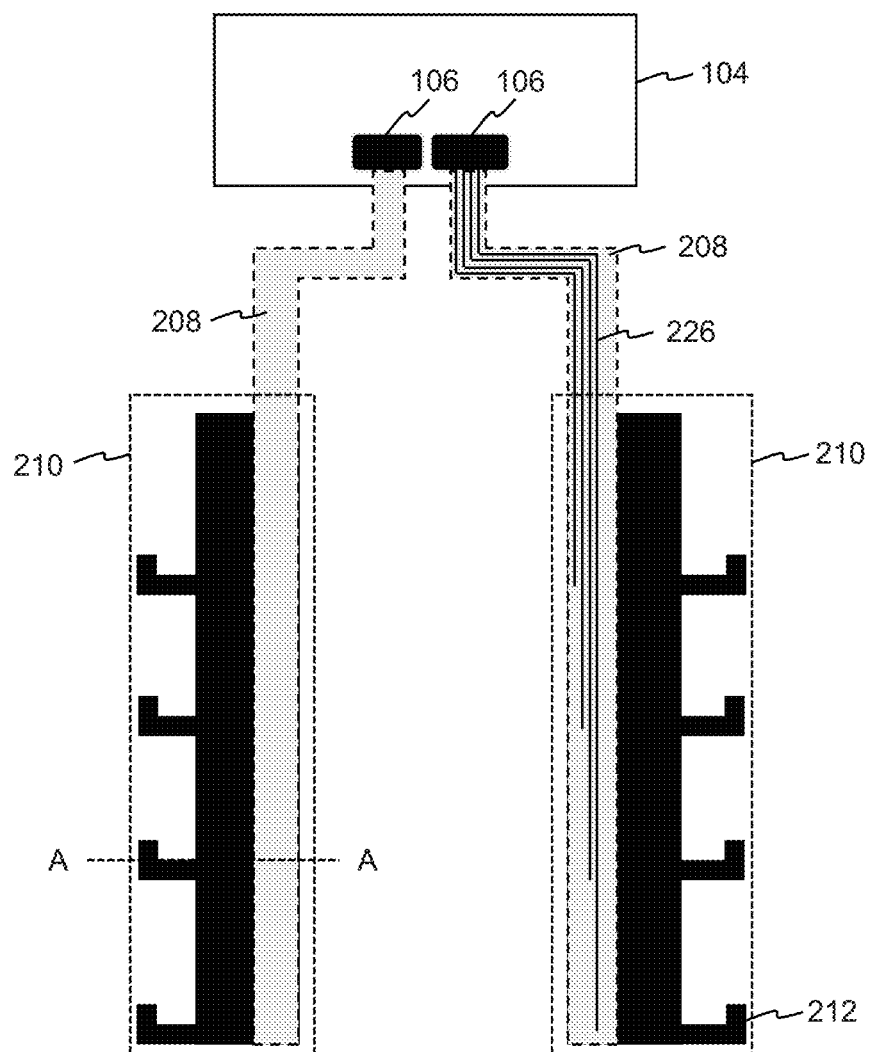
FIG. 2A illustrates an overview of a combined flexible printed circuit board, in accordance with one or more embodiments.

FIG. 2A illustrates an overview of a combined flexible printed circuit (FPC) board, in accordance with one or more embodiments. A multi-antenna system disclosed in FIG. 2A comprises an antenna part 210 comprising antenna lines forming antenna elements 212 and a cable part 208 comprising feeding lines 226 for the antenna elements 212. The cable part 208 is connected to a printed circuit board 104 via connectors 106. The interconnection to the printed circuit board 104 which contains radio frequency (RF) electronics may utilize a multi I/O RF connector or low resistance direct interconnection. In the combined solution, the antenna part 210 and the cable part 208 are made of a single integrated FPC board. The multi-antenna system can be placed on mobile apparatus mechanics either on a flat or curved surface. The multi-antenna system may be, for example, a multiple-input and multiple-output (MIMO) system or an antenna array.

In an embodiment, the cable part 208 and the antenna part 210 may comprise also other electronics, for example, at least one sensor and/or at least one switch. Further, the cable part 208 and the antenna part 210 may be used to route signals, for example, universal serial bus (USB) signals. This provides an integrated and a simple solution that saves space within the mobile apparatus 120.

In an embodiment, the cable part 208 may comprise at least one of a signal line for a sensor, a signal line for a light component, a signal line for a universal serial bus interface and a signal line for a switch. This provides an integrated and a simple solution that saves space within the mobile apparatus 120.

Figure 2B:
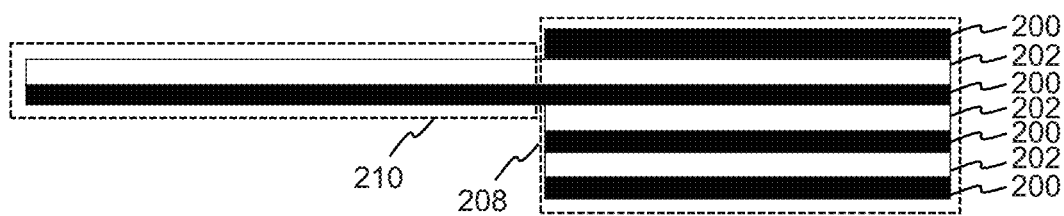
FIG. 2B illustrates a cross-sectional view of the combined flexible printed circuit board, in accordance with one or more embodiments.

FIG. 2B illustrates a cross-sectional view of the combined flexible printed circuit board illustrated in FIG. 2A, in accordance with one or more embodiments. The cross-sectional view has been taken from the section A-A indicated in FIG. 2A.

The combined flexible printed circuit board comprises conductor layers 202 and insulation layers 200. In FIG. 2B, the antenna part 210 consists of a single conductor layer 202 and the cable part is realized using three conductor layers 202. The antenna lines may be placed side by side with each other in the cable part 208 ensuring enough separation to ensure sufficient isolation. In some embodiments, antenna matching and other electrical components can be placed on the flexible circuit board.

In some embodiments, in the cable part 208, low dielectric loss material, for example, liquid crystal polymer (LCP), low dielectric loss polyimide or polytetrafluoroethylene (PTFE) may be utilized to ensure the thinnest possible structure with sufficient performance in terms of dielectric and conductor loss.

In some embodiments, the dielectric material of the antenna part 210 may be of the same material as the cable part 208. In another embodiment, it is possible to use a mixed material solution whereby the layer on which the antenna part 210 resides is made from a lower cost material.

The solution disclosed in FIG. 2B provides a thin structure. Typically the stripline flexible printed circuit board with good electrical properties has a thickness of 0.3 mm which is thinner than a micro coaxial cable with equivalent electrical properties. Further, the discussed solution may provide a cost benefit against multiple micro coaxial cable systems.

Figure 2C:
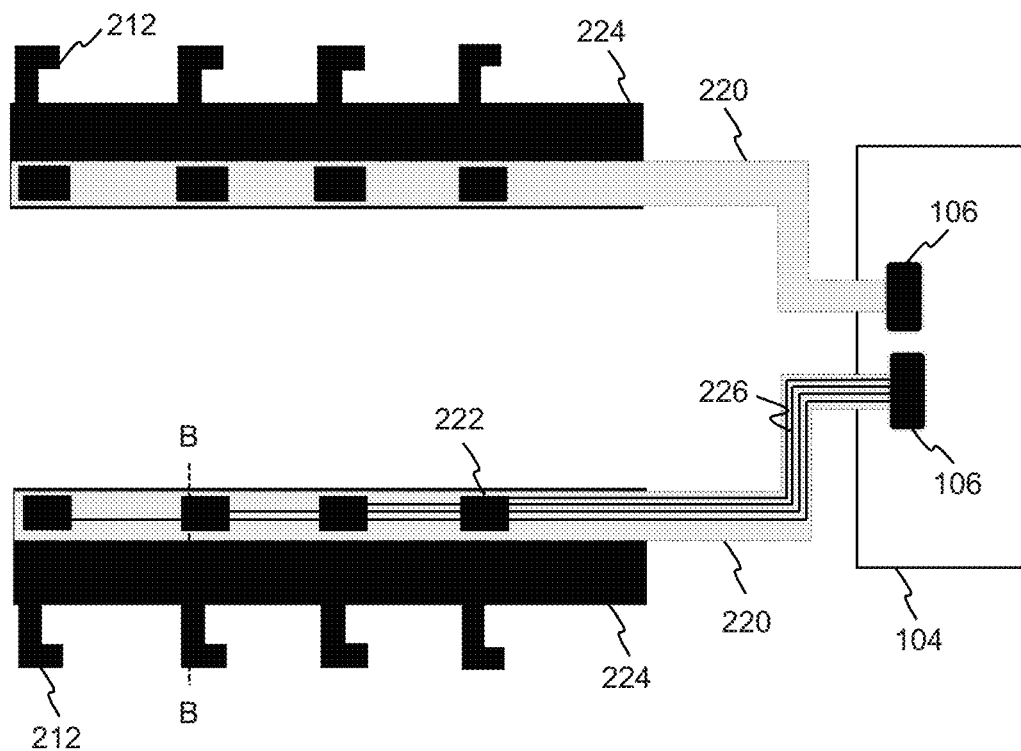
FIG. 2C illustrates an overview of a separate stripline flexible printed circuit board, in accordance with one or more embodiments.

FIG. 2C illustrates an overview of a separate stripline flexible printed circuit board, in accordance with one or more embodiments. A multi-antenna system disclosed in FIG. 2C comprises separate flexible printed circuits for antenna functionality and cable functionality. A first flexible printed circuit board comprises an antenna part 224 comprising antenna lines forming antenna elements 212. A second flexible circuit board comprises a cable part 220 comprising feeding lines 226 for the antenna elements 212. The second flexible printed circuit board is connected to a printed circuit board 104 via connectors 106. The interconnection to the printed circuit board 104 which contains radio frequency (RF) electronics may utilize a multi I/O RF connector or low resistance direct interconnection. The multi-antenna system can be placed on mobile apparatus mechanics either on a flat or curved surface. The multi-antenna system may be, for example, a multiple-input and multiple-output (MIMO) system or an antenna array.

In some embodiments, the first flexible printed circuit board may utilize a single conductor layer substrate material, in particular may utilize a low cost single conductor layer substrate material, for example, polyester (PET) or polyethylene naphthalate (PEN). The second flexible printed circuit board may utilize a stripline form, and the materials and dimensions may be configured to comply with radio frequency (RF) signal integrity requirements.

In some embodiments the interconnection at 222 between the first flexible printed circuit board and the second flexible printed circuit board may be achieved with a low resistance direct interconnection technology, for example, hotbar soldering or anisotropically conductive adhesive (ACA), or other suitable connection. These technologies give a very low interconnection stacking height. Further, a low interconnection resistance enables keeping resistive losses low enough for radio frequency signals.

In an embodiment, in the cable part 220, low dielectric loss material, for example, liquid crystal polymer (LCP), low dielectric loss polyimide or polytetrafluoroethylene (PTFE) may be utilized to ensure the thinnest possible structure with sufficient performance in terms of dielectric and conductor loss.

Figure 2D:
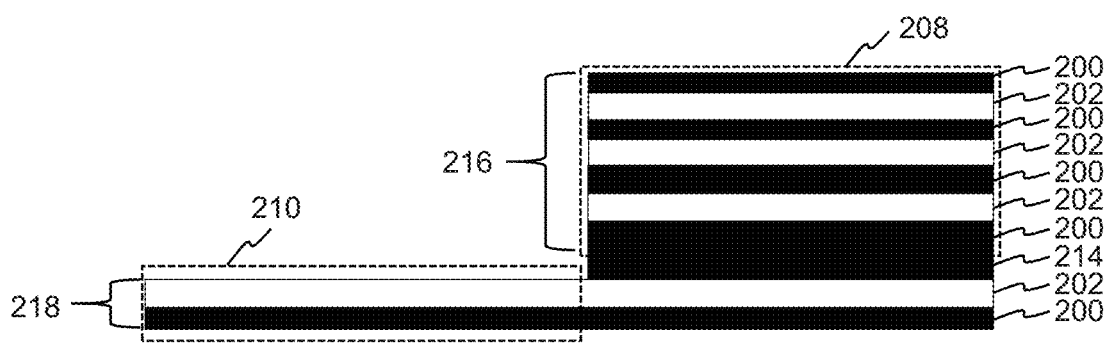
FIG. 2D illustrates a cross-sectional view of the separate stripline flexible printed circuit board, in accordance with one or more embodiments.

FIG. 2D illustrates a cross-sectional view of the separate stripline flexible printed circuit board illustrated in FIG. 2C, in accordance with one or more embodiments. The cross-sectional view has been taken from the section B-B indicated in FIG. 2C.

In FIG. 2D, an antenna part 210 consists of a single conductor layer 202 and a cable part 218 is realized using three conductor layers 202. An insulation layer 200 may be provided between two conductor layers 202. FIG. 2D illustrates that a first flexible printed circuit board 218 comprising the antenna part 210 and a second flexible printed circuit board 216 comprising the cable part 208 are connected by an interconnection layer 214. The antenna lines may be placed side by side with each other in the cable part 208 ensuring enough separation to ensure sufficient isolation. Further, in one embodiment, antenna matching and other electrical components can be placed on the flexible circuit board.

In some embodiments, in the cable part 208, low dielectric loss material, for example, liquid crystal polymer (LCP), low dielectric loss polyimide or polytetrafluoroethylene (PTFE) may be utilized to ensure the thinnest possible structure with sufficient performance in terms of dielectric and conductor loss.

The solution disclosed in FIG. 2D also provides a thin structure. Typically the stripline flexible printed circuit board with good electrical properties has a thickness of 0.3 mm which is thinner than a micro coaxial cable with equivalent electrical properties. Further, the discussed solution may provide a cost benefit against multiple micro coaxial cable systems.

Any range or device value given herein may be extended or altered without losing the effect sought. Also any embodiment may be combined with another embodiment unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item may refer to one or more of those items.

Aspects of any of the embodiments described above may be combined with aspects of any of the other embodiments described to form further embodiments without losing the effect sought.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification.

The invention claimed is:

1. A multi-antenna system, comprising:
an antenna part comprising antenna lines forming antenna elements; and
a cable part comprising feeding lines for the antenna elements,
wherein
both the antenna part and the cable part are implemented using a flexible printed circuit board,
the antenna part comprises a single conductor layer area over a first dielectric material and the cable part comprises a three conductor layer area having a second material between adjacent conductor layers of the three conductor layer area, and
the first dielectric material is different from the second dielectric material.

2. The multi-antenna system of claim 1, wherein the antenna part and the cable part are made of a single integrated flexible printed circuit board.

3. The multi-antenna system of claim 1, wherein the antenna part is included in a first flexible printed circuit board and the cable part is included in a second flexible printed circuit board, the first flexible printed circuit board and the second flexible printed circuit board being interconnected to each other.

4. The multi-antenna system of claim 3, wherein the first flexible printed circuit board and the second flexible printed circuit board are directly interconnected to each other with a conductive material.

5. The multi-antenna system of claim 3, wherein the first flexible printed circuit board and the second flexible printed circuit board are directly interconnected to each other by way of hotbar soldering.

6. The multi-antenna system of claim 3, wherein the cable part comprises one or more of a liquid crystal polymer, a polyimide or a polytetrafluroethylene.

7. The multi-antenna system of claim 3, wherein the antenna part comprises a single conductor layer substrate material.

8. The multi-antenna system of claim 7, wherein the single conductor layer substrate material is in direct physical contact with the first dielectric material.

9. The multi-antenna system of claim 3, wherein the first flexible printed circuit board and the second flexible printed circuit board are directly interconnected to each other by way of an anisotropically conductive adhesive.

10. The multi-antenna system of claim 1, wherein the cable part has a stripline form.

11. The multi-antenna system of claim 1, wherein the flexible printed circuit board comprises antenna matching components.

12. The multi-antenna system of claim 1, wherein the cable part comprises a signal line for a sensor.

13. The multi-antenna system of claim 1, wherein the cable part comprises a signal line for a light component.

14. The multi-antenna system of claim 1, wherein the cable part comprises a signal line for a universal serial bus interface.

15. The multi-antenna system of claim 1, wherein the cable part comprises a signal line for a switch.

16. The multi-antenna system of claim 1, wherein the multi-antenna system is a multiple-input and multiple-output (MIMO) system.

17. The multi-antenna system of claim 1, wherein the multi-antenna system further comprises:
a connector for connecting the multi-antenna system to a printed circuit board within a wireless communication apparatus.

18. A wireless communication apparatus comprising:
a printed circuit board; and
a multi-antenna system connected to the printed circuit board,
wherein
the multi-antenna system comprises:
an antenna part comprising antenna lines forming antenna elements; and
a cable part comprising feeding lines for the antenna elements,
both the antenna part and the cable part are implemented using a flexible printed circuit board,
the antenna part comprises a single conductor layer area over a first dielectric material and the cable part comprises a three conductor layer area having a second material between adjacent conductor layers of the three conductor layer area, and
the first dielectric material is different from the second dielectric material.

19. The wireless communication apparatus of claim 18, wherein the multi-antenna system is a multiple-input and multiple-output (MIMO) system.

20. The wireless communication apparatus of claim 18, wherein the multi-antenna system further comprises a connector that couples the multi-antenna system with the printed circuit board.

* * * * *